United States Patent [19]

Walsh

[11] 4,097,885
[45] Jun. 27, 1978

[54] COMPACT, TWO-PHASE CHARGE-COUPLED-DEVICE STRUCTURE UTILIZING MULTIPLE LAYERS OF CONDUCTIVE MATERIAL

[75] Inventor: Lloyd R. Walsh, San Jose, Calif.

[73] Assignee: Fairchild Camera and Instrument Corp., Mountain View, Calif.

[21] Appl. No.: 732,614

[22] Filed: Oct. 15, 1976

[51] Int. Cl.² .................. H01L 29/78; Ho1L 29/04; G11C 19/28
[52] U.S. Cl. .................................. 357/24; 357/59; 357/91; 307/221 D
[58] Field of Search .................. 357/24, 59, 91; 307/221 D

[56] References Cited

U.S. PATENT DOCUMENTS

| 3,795,847 | 3/1974 | Engeler et al. | 357/24 |
| 3,931,674 | 1/1976 | Amelio | 357/24 |
| 3,943,543 | 3/1976 | Caywood | 357/24 |
| 3,967,306 | 6/1976 | Bower | 357/24 |

OTHER PUBLICATIONS

Sequin et al., *Charge Transfer Devices*, Academic Press, N.Y., (7/75), pp. 20-23, 32-39.
Mohsen et al., "Fabrication and Performance of Offset-Mask Charge Coupled Devices", IEEE J. Solid--State Circuits, vol. SC-11, (2/76), pp. 180-188.

*Primary Examiner*—William D. Larkins
*Assistant Examiner*—Gene M. Munson
*Attorney, Agent, or Firm*—Alan H. MacPherson; Henry K. Woodward; Robert C. Colwell

[57] ABSTRACT

An improved charge-coupled-device gate structure utilizes three depositions of electrically conductive material to form electrodes, thereby allowing fabrication of two-phase CCD gate structures occupying less wafer surface area and operating at faster speeds than conventional charge-coupled-device gate structures.

10 Claims, 5 Drawing Figures

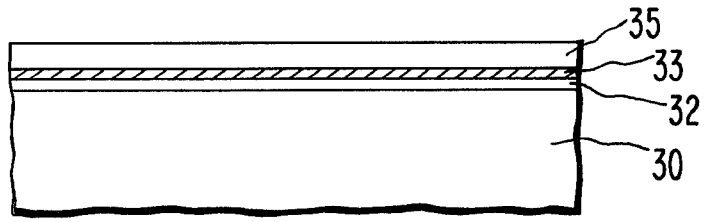
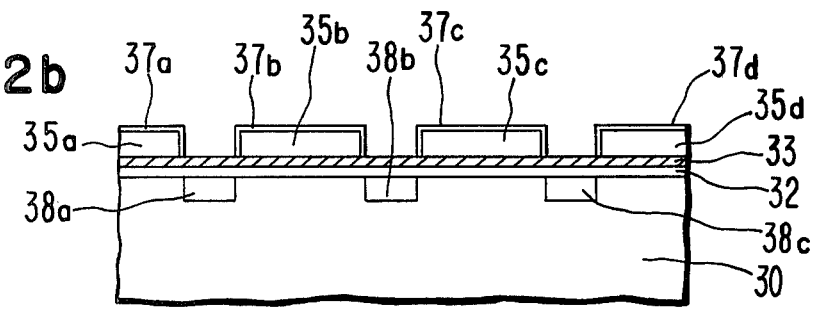
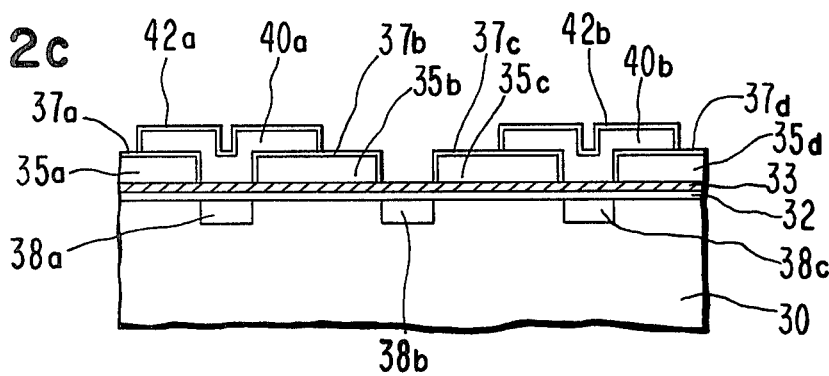

4,097,885

COMPACT, TWO-PHASE CHARGE-COUPLED-DEVICE STRUCTURE UTILIZING MULTIPLE LAYERS OF CONDUCTIVE MATERIAL

BACKGROUND OF THE INVENTION

1. Field of the Invention

This invention relates generally to charge-coupled device (often referred to as CCD) gate structures, and in particular to an improved, two-phase CCD gate structure which is faster and more compact than existing structures.

2. Description of the Prior Art

Charge-coupled device gate structures are well known in the integrated circuit arts. Such structures operate to move charge in a semiconductor material in response to application of selected potentials to various electrodes disposed near the semiconductor materials. The direction of charge movement is controlled by barriers implanted in the semiconductor material beneath portions of the electrodes. The theory of operation, manner of fabrication, and the resulting structures of CCD devices have been the subject of various patents. See, e.g., U.S. Pat. No. 3,931,674 entitled "Self Aligned CCD Element Including Two Levels of Electrodes and Method of Manufacture Therefore," by Amelio and assigned to Fairchild Camera and Instrument Corporation, assignee of this invention. One such coventional CCD gate structure is shown in FIG. 1, and includes a wafer 11; implanted barriers 12a, 12b, 12c and 12d, insulating layers 15, 16, 21a, 21b, and 21c; and electrically conductive regions 18a, 18b, 18c, 28a 28b, 28c and 28d. In a typical two-phase CCD gate embodiment, conductive material 18a and 28b will be electrically connected to form a first two-phase gate and material 18b will be electrically connected to material 28c to form a second two-phase gate. Similarly, materials 18c and 28d will be connected to form a first gate of an adjacent structure.

The structural design and manner of fabrication of the CCD gate structure shown in FIG. 1 impose what have now been discovered to be unnecessary limitations upon the minimum size such CCD structures may occupy. The compactness of CCD structures in particular, and integrated circuits in general, is limited by, among other things, the alignment and etching tolerances of existing masking technology. Such tolerances normally expressed as one set of "design rules", in effect mandate some minimum separation between any two noncontiguous regions of a given structure which are not to be electrically connected. For example, utilizing a "3 micron design rule" a two-phase CCD gate cell such as that shown in FIG. 1 will typically consume approximately 20 microns of wafer surface. This results from the necessity of separating the edges of each electrode from an adjacent but non-contiguous electrode formed during the same process step by the amount of whatever design rule is invoked — in the example, 3 microns. Thus, the left edge of electrode 28d must be situated at least 3 microns from the right edge of electrode 28c, as in conventional structures these are formed in the same process step and must not be electrically connected. Additionally, it is well known to those skilled in the semiconductor arts that the same or other sets of "design rules" will influence other aspects of the semiconductor structure. That is, certain design rules are applied to insure the formation of the structure shown in FIG. 1 without gaps, for example, so electrode 28b is disposed over barrier 12b.

SUMMARY OF THE INVENTION

This invention overcomes several disadvantages of conventional CCD gate structures by providing a more compact structure capable of operating at higher speeds. In particular, the structure of this invention, if fabricated according to the same design rules as conventional structures, can be made in approximately seven-tenths the wafer surface area of such structures. This reduction in size allows more structures to be formed within a given area, thereby increasing the speed of operation of both individual CCD gate structures and arrays of structures. Conversely the structure of this invention can be formed according to less stringent design rules to create new CCD gate structures of the same size as existing structures but said new structures thereby having increased manufacturing tolerances to allow their fabrication with lower quality equipment at a lower cost. Of course compactness and speed of operation each may be "traded off" to create a wide range of intermediate-sized CCD gate structures which are somewhat more compact and faster than existing structures, but which may be fabricated with larger manufacturing tolerances than existing CCD gate structures.

According to one embodiment of this invention, a charge-coupled-device gate structure is fabricated, after initially forming from a first layer of electrically conductive material disposed on the surface of a substrate a selected number of discrete electrodes, and forming barrier regions in the substrate between the electrodes, by separately forming a second set and a third set of electrodes, each set being formed over every other one of the barrier regions. The separate formation of the second set and third set of electrodes according to this invention eliminates the limitations imposed upon the dimensions of the CCD gate structure by the alignment tolerances associated with simultaneously forming electrodes over all barrier regions.

BRIEF DESCRIPTION OF THE DRAWINGS

FIGS. 2a through 2d illustrate one process by which the structure of the present invention may be fabricated;

FIG. 2d shows a cross-section of one embodiment of the charge-coupled-device gate structure of the present invention.

DETAILED DESCRIPTION OF THE INVENTION

Figure 2D:
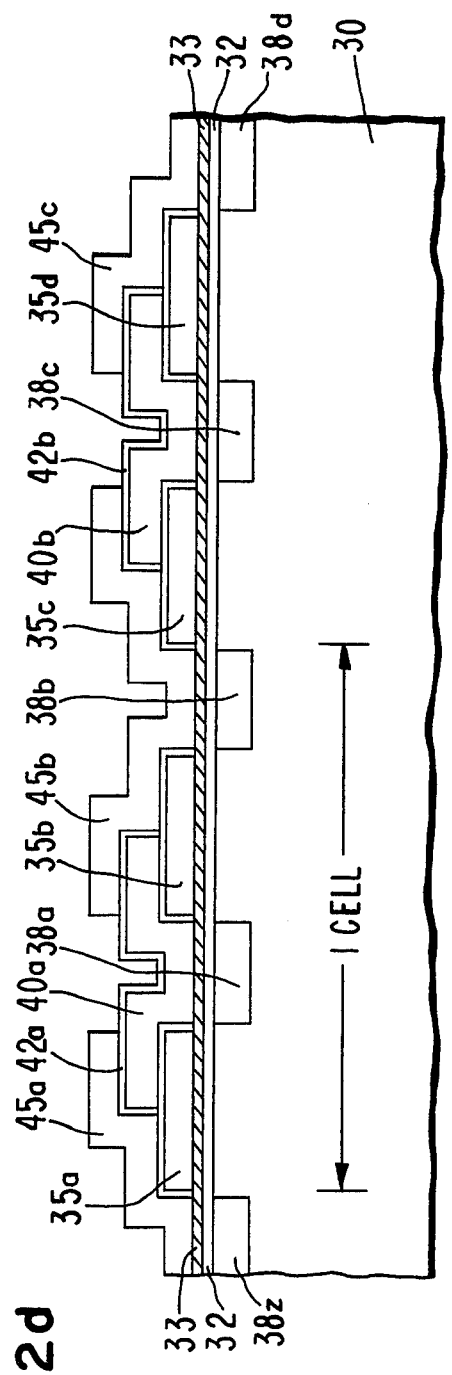

One preferred embodiment of the structure of this invention is shown in FIG. 2d. The structure depicted in FIG. 2d will be described in conjunction with FIGS. 2a, 2b and 2c, which depict earlier fabrication steps according to one method of fabricating the structure shown in FIG. 2d.

On a semiconductor substrate 30, typically P conductivity type silicon, shown in FIG. 2a, a thin layer of insulating material 32 is formed. Insulating material 32 is typically thermally grown silicon dioxide but may be any suitable nonconductive material. A second layer of insulating material 33 is then formed on the surface of insulating material 32. Layer 33 may be any insulating material, but typically will be silicon nitride because thereby thermal oxide growth will be inhibited. During later processing steps associated with one method of fabricating the structure of FIG. 2d, layer 33 will prevent further growth of insulating material 32, if layer 32 is formed of silicon dioxide. Other materials performing an equivalent function to silicon nitride layer 33 may be substituted for silicon nitride. Following formation of insulating layer 33, a first layer of conductive material 35 is formed on the surface of silicon nitride layer 33. First conducting material 35 will typically be polycrystalline silicon, although other conductive material may also be used. Polycrystalline silicon material 35 can be deposited as doped polycrystalline silicon, or, in some embodiments, undoped polycrystalline silicon may be deposited which is later doped. The appearance of the wafer following formation of insulating material 32, silicon nitride layer 33, and polycrystalline silicon layer 35, is shown in FIG. 2a.

Utilizing processing techniques well known in the semiconductor manufacturing arts, polycrystalline silicon layer 35 is masked and etched, or otherwise selectively removed, to create individual electrodes 35a, 35b, 35c and 35d (See FIG. 2b). After electrodes 35a, 35b, 35c, and 35d are formed, a second layer of insulating material 37 is formed on the wafer surface. This insulating material is shown in FIG. 2b as regions 37a, 37b, 37c, and 37d. Insulating material 37 will typically be an oxide of silicon, for example, silicon dioxide. When silicon nitride is utilized to form layer 33, and silicon dioxide is utilized as insulating material 37, no insulating material will be formed upon the surface of silicon nitride layer 33, for example, in the region between any two adjacent electrodes. Silicon nitride layer 33 will also prevent layer 32, if it is silicon dioxide, from growing during the formation of insulating material 37. Following formation of insulating material 37, barrier regions 38a, 38b, and 38c are formed in substrate 30. Barrier regions 38 typically will be formed from P type semiconductor material, and may be formed in any well-known manner. Utilization of well-known ion implantation technology, however, has been found particularly useful in the formation of barrier regions 38a, 38b, and 38c, because the lateral position of the ions may be precisely controlled relative to that of the gate electrodes. The doping concentration of the other semiconductor materials in which the ions may lodge will be sufficiently great so the implanted ions will not have a significant effect upon the function of said other materials. The implanted barrier regions 38a, 38b, and 38c establish the directionality of charge transfer in the gate structure of this invention. The appearance of the semiconductor structure following the previously-described processing steps is shown in FIG. 2b.

Additional processing steps will now be described in conjunction with FIG. 2c. A second layer of electrically conductive material 40 is formed on the surface of the semiconductor structure. Typically conductive layer 40 will be formed from polycrystalline silicon or deposited as undoped polycrystalline silicon and then doped. In the manner previously described in conjunction with layer 35, polycrystalline silicon layer 40 will be selectively etched to create electrodes over every other barrier region. Such electrodes 40a and 40b are depicted in FIG. 2c over barrier region 38a and 38c. The polycrystalline silicon material deposited over barrier region 38b has been removed. After polycrystalline silicon layer 40 is selectively etched to create electrodes 40a and 40b, insulating material 42a and 42b is formed on the surface of the polycrystalline silicon material 40a and 40b. Typically insulating material 42a will be silicon dioxide, and as previously set forth, it will not form on the surface of silicon nitride layer 33. See, for example, the region immediately above barrier region 38b. The appearance of the semiconductor structure following formation of oxide 42a and 42b is shown in FIG. 2c.

The remaining fabrication steps necessary to complete the two-phase charge-coupled-device gate structure of this invention are described in conjunction with FIG. 2d. Next, a third layer of conductive material 45 is formed across the surface of the wafer. As with the first and second layers of conductive material 35 and 40, conductive material 45 typically will be polycrystalline silicon deposited either already doped, or doped in a subsequent step following its deposition. Similarly, as previously discussed in conjunction with the second layer of polycrystalline silicon 40, polycrystalline silicon layer 45 will be masked and etched to create separate electrodes 45a, 45b, and 45c, as shown in FIG. 2d. The appearance of the semiconductor structure following removal of the undesired portions of polycrystalline silicon layer 45 is shown in FIG. 2d.

One of the two-phase gates will be formed by electrically connecting electrode 35a with electrode 40a, while the second two-pahse gate will be formed by electrically connecting electrode 35b with electrode 45b. The semiconductor fabrication processes and technology to accomplish these electrical connections, or other connections if other structures are desired, are well-known and are therefore not shown in the drawings. Typically, however, an additional layer of insulating material will be formed across the entire surface of the structure shown in FIG. 2d. Openings through this layer of insulating material will be made to allow ohmic contact to the underlying regions of polycrystalline silicon from the surface of the underlying insulating material. Metallic contacts may then be formed across the surface of the overlying insulating material to provide any desired electrical connections between the various regions of the semiconductor structure shown in FIG. 2d. The combined assembly of electrodes and barrier regions necessary to make a two-phase charge-coupled-device is designated as "one cell" in FIG. 2d. Of course, a second cell may be formed by connecting electrode 35c to electrode 40b, and by connecting electrode 35d to electrode 45c. Additional cells are not shown in FIG. 2d. The electrical connections between cells can be made at any desired cross-sectional location of the structure shown in FIG. 2d.

Figure 1:
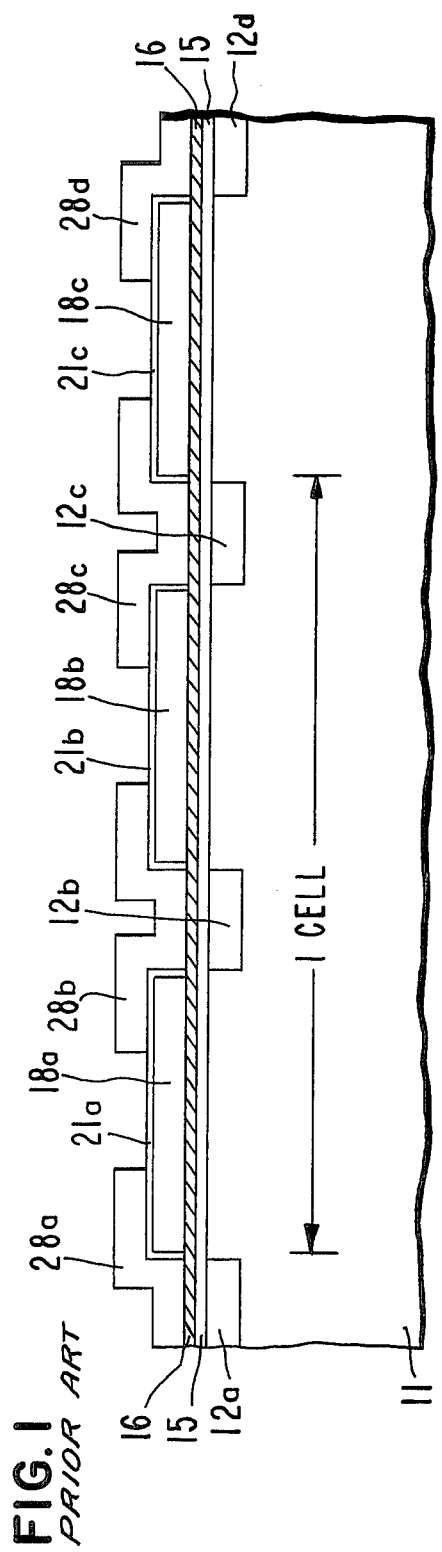
FIG. 1 shows a cross-section of a typical prior-art charge-coupled-device gate structure.

One of the primary advantages of the structure of this invention is illustrated by comparing FIG. 1 with FIG. 2d. These two Figures, drawn to approximately the same scale, clearly show the reduction in cell size which accompanies the structure of this invention. Typical prior-art cells such as shown in FIG. 1 consume about 20 microns of wafer surface, while the embodiment of this invention shown in FIG. 2d can be fabricated in 14 microns. Thus, the cell shown in FIG. 2d is 30% shorter than the cell shown in FIG. 1. This reduction in cell size allows the charge-coupled device to function faster and therefore increases the limit of high-frequency performance. Of course, as previously discussed, if a compact cell geometry is not desired, the structure shown in FIG. 2d can be fabricated in a longer embodiment, which will therefore be designed with more generous alignment tolerances. For example, if the structure depicted in FIG. 2d is limited by both etching and alignment tolerances, fabrication of the structure shown in FIG. 2d in 20 microns will result in a structure which is limited only by etching tolerances, and is therefore easier to construct.

Although the structure of one embodiment of the charge-coupled-device of this invention has been described in conjunction with specific conductivity types and semiconductor material, it will be evident to those skilled in the semiconductor arts that complementary conductivity types and other semiconductor materials may also be used to fabricate this invention.

What is claimed is:

1. At least one semiconductor cell structure, a cell thereof comprising:

a substrate formed from selected semiconductor material of one conductivity type;

a region of first insulating material formed on a first surface of the substrate;

a plurality of regions of first electrically conductive material disposed at selected intervals on the first insulating material;

a plurality of regions of second insulating material formed on all portions of first electrically conductive material which are not in contact with the first insulating material;

first and second spaced apart barrier regions formed in the substrate adjacent to the first insulating material and in regions of the substrate not overlaid by either one of the first electrically conductive material and the second insulating material, the first and second barrier regions being the same conductivity type as the substrate, but each having a different impurity concentration than the substrate;

a region of second electrically conductive material disposed on that portion of the first insulating material over alternate barrier regions, and disposed on the second insulating material overlying selected portions of the first electrically conductive material;

a region of third insulating material formed on all portions of second electrically conductive material which are not in contact with either one of the first and the second insulating materials;

a region of third electrically conductive material disposed on that portion of the first insulating material over remaining barrier regions, and disposed on selected portions of the second and the third regions of insulating material;

means for electrically connecting alternating regions of first electrically conductive material to the second electrically conductive material; and means for connecting the remaining regions of the first electrically conductive material to the third electrically conductive material.

2. A semiconductor structure as in claim 1 wherein the first insulating material comprises a first and a second layer, the first layer being adjacent the substrate and the second layer being adjacent the first layer.

3. A semiconductor structure as in claim 2 wherein the substrate is silicon, the first layer of insulating material is silicon dioxide, and the second layer of insulating material is silicon nitride.

4. Structure as in claim 3 wherein the substrate and the barrier regions are P conductivity type.

5. Structure as in claim 3 wherein the substrate and the barrier regions are N conductivity type.

6. A semiconductor structure as in claim 1 wherein the barrier regions are formed in the substrate by ion implantation.

7. A semiconductor structure as in claim 1 wherein the barrier regions are periodically spaced in the substrate.

8. A semiconductor structure as in claim 1 wherein each of said regions of conductive material is formed from polycrystalline silicon.

9. A semiconductor structure as in claim 1 wherein the second and the third insulating materials are silicon dioxide.

10. A semiconductor structure as in claim 1 wherein the region of third electrically conductive material is disposed to completely overlie at least all of one region of first electrically conductive material.

* * * * *